United States Patent [19]

Redfern et al.

[11] 4,238,839
[45] Dec. 9, 1980

[54] LASER PROGRAMMABLE READ ONLY MEMORY

[75] Inventors: Thomas P. Redfern; Thomas M. Frederiksen; Joseph J. Connolly, Jr., all of San Jose, Calif.

[73] Assignee: National Semiconductor Corporation, Santa Clara, Calif.

[21] Appl. No.: 31,562

[22] Filed: Apr. 19, 1979

[51] Int. Cl.³ .................... G11C 17/00; G11C 17/06
[52] U.S. Cl. ....................................... 365/96; 365/104
[58] Field of Search ................. 365/94, 96, 100, 104

[56] References Cited

U.S. PATENT DOCUMENTS

| | | | |
|---|---|---|---|
| 3,778,886 | 12/1973 | Shields et al. | 365/96 |
| 4,064,493 | 12/1977 | Davis | 365/96 |
| 4,125,880 | 11/1978 | Taylor | 365/96 |

OTHER PUBLICATIONS

Cook et al., "Read-Only Memory Fabrication by Laser Formed Connections," *IBM Tech. Disc. Bul.*, vol. 15, No. 8, 1/73, pp. 2371-2372.

*Primary Examiner*—Stuart N. Hecker
*Attorney, Agent, or Firm*—Gail W. Woodward; James A. Sheridan

[57] ABSTRACT

A read only memory is fabricated using metal oxide semiconductor technology and is intended for incorporation into large scale integrated circuits. A plurality of memory transistors is arrayed in a configuration having columns, each of which is associated with an address line, and rows, each of which is associated with a word line. A memory transistor is located at each intersection of an address line and a word line. Each memory transistor represents a bit location and includes a severable conductive link coupled in series and located on top of the field oxide surrounding the memory transistors. Each memory transistor in a particular column has its gate coupled to an address line. Each memory transistor in a particular row completes a series circuit which includes the severable conductive link between a first power supply terminal and a word line. Each word line includes a resistor coupled to the other power supply terminal. When a particular column is addressed, and the associated transistors in the address line turned on, all of the bits in the associated word will be "ones." The memory is programmed as desired after circuit manufacture in the wafer die sort operation by severing selected links with a laser beam. The severed device will program a "zero" into the bit location. The word lines are coupled to a decoder that employs an array of gates having input pairs, one of which displays hysteresis. The memory also includes an external program simulation circuit which permits externally generating a particular digital word to simulate the memory content prior to programming.

5 Claims, 6 Drawing Figures

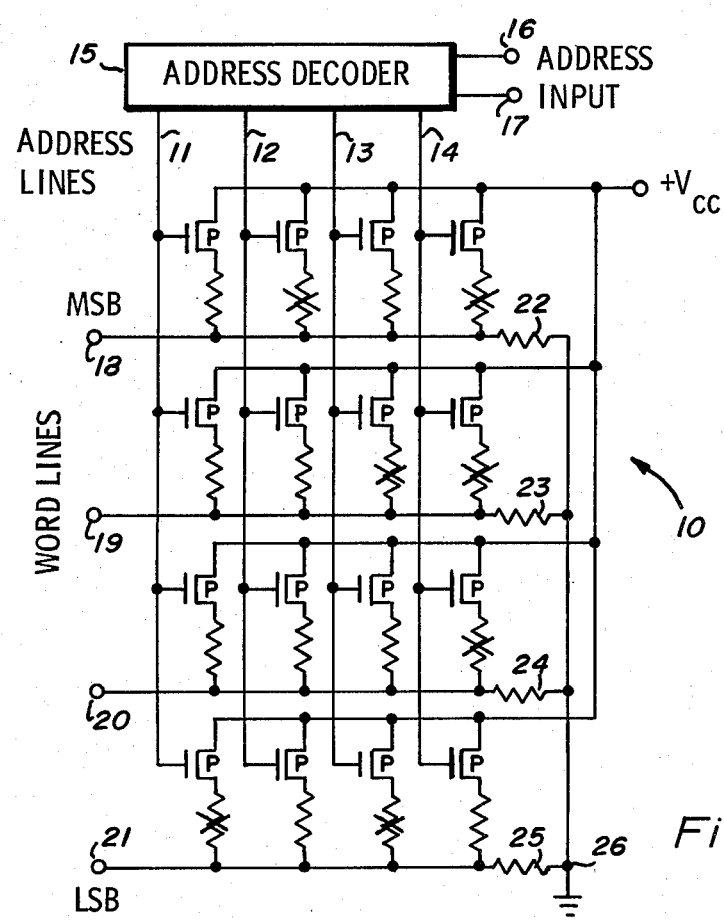
Fig_1
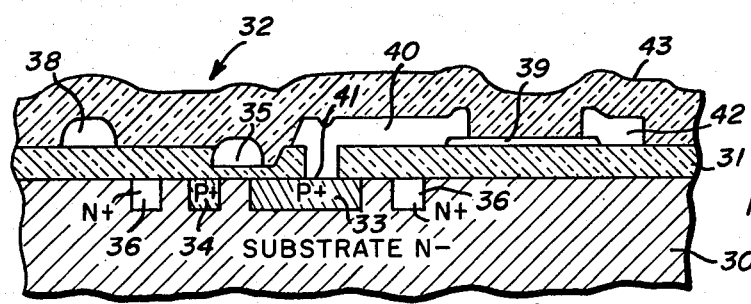
Fig_2
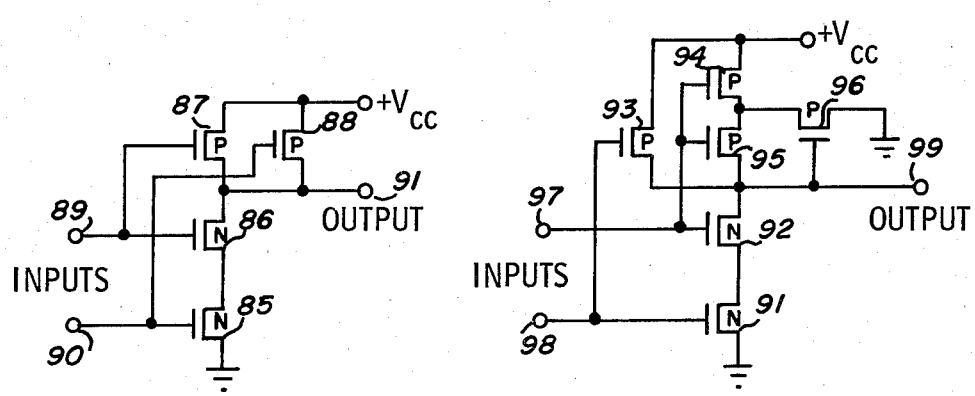
Fig_5 (PRIOR ART)   Fig_6

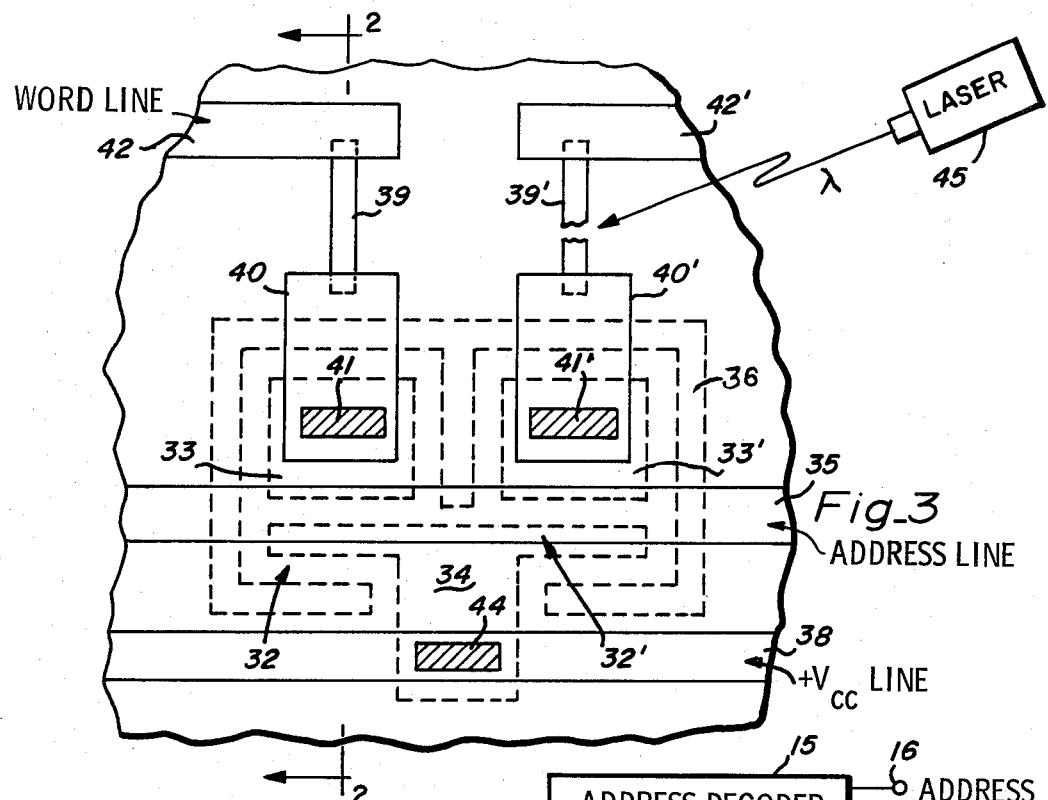
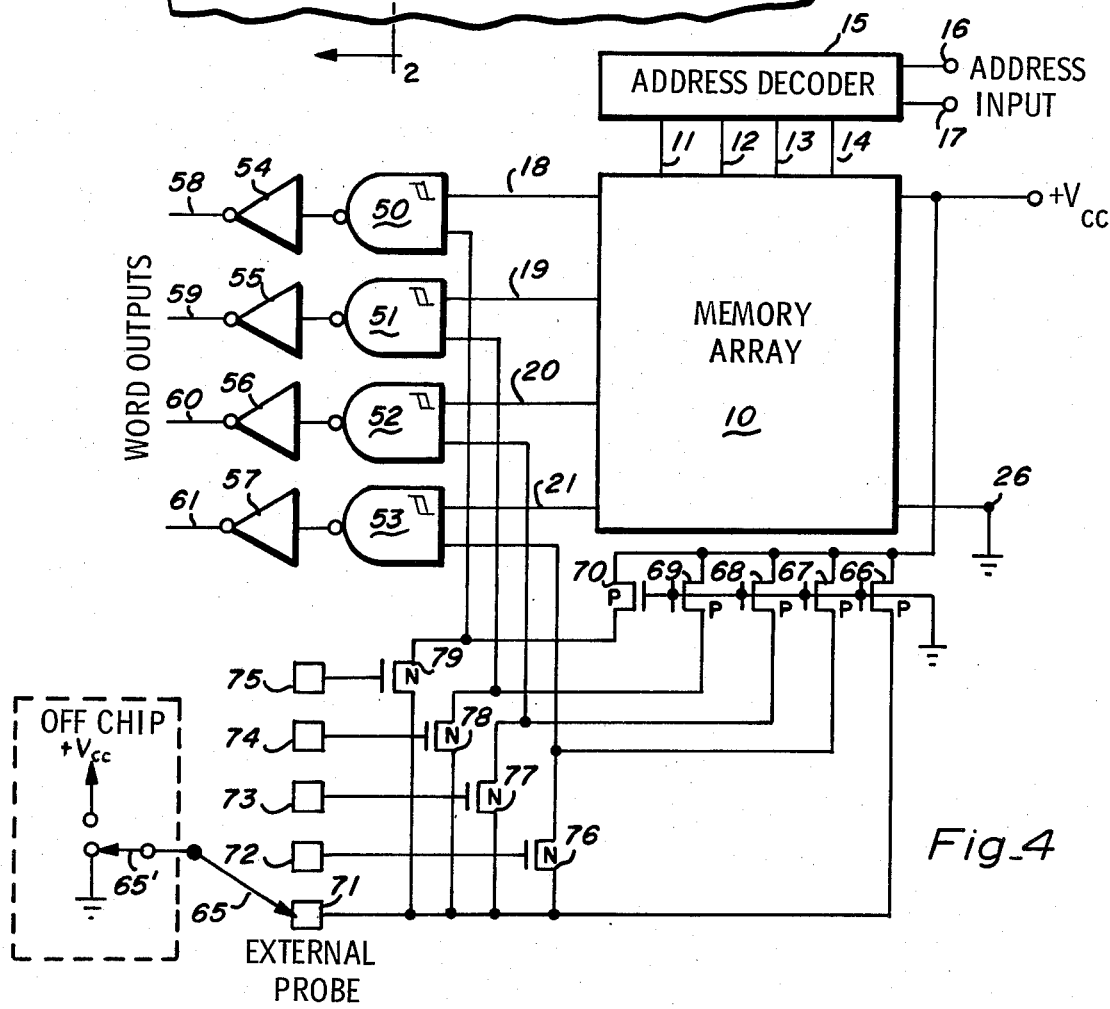

LASER PROGRAMMABLE READ ONLY MEMORY

BACKGROUND OF THE INVENTION

The invention is intended for use in large scale integrated (LSI) circuits using metal oxide semiconductor (MOS) technology and in particular silicon gate MOS. The invention generally relates to a read only memory (ROM) that can be laser programmed after construction to create an LPROM that can be associated with the other devices in an LSI circuit. In particular, complementary (CMOS) technology is employed to fabricate the LPROM in a form that permits programming during the LSI manufacturing process.

PROMs are well-known in the prior art and many diverse forms have been developed commercially. Some are field programmable by the user for a particular application and some are programmed by the manufacturer in accordance with a user requirement. Most commonly, user programming is achieved by blowing fuse links in the memory array at selected memory locations. This is most useful in bipolar transistor circuits in which high current densities are easily achieved. However, in MOS technologies, the fuse blowing technique is difficult to achieve and its use can produce undesirable side effects in associated circuitry. Another form of PROM employs a predetermined metal mask configuration that is designed to determine the memory content. Thus, the memory function is predetermined and created in the manufacturing process. This approach does not permit modifying the memory content to accommodate the characteristics of the associated circuitry.

SUMMARY OF THE INVENTION

It is an object of the invention to provide a PROM in LSI form which can be laser trimmed to program the memory as a part of the manufacturing process.

It is a further object of the invention to incorporate a PROM into an LSI circuit so that the circuit can be digitally trimmed to bring its performance into specification by programming the PROM to trim the circuit.

It is a further object of the invention to incorporate an LPROM into a CMOS form of LSI circuit wherein the LPROM acts to trim the circuit performance and is digitally programmed during manufacture to correct errors in the circuit.

It is a still further object of the invention to employ a laser to sever links in a memory to create an LPROM that can be associated with an operating circuit in LSI wafer fabrication wherein laser trimming is applied to digitally trim the circuit in wafer die sort.

These and other objects are achieved as follows. A ROM is incorporated into the structure of an operating circuit to be fabricated in LSI form on a silicon wafer. The ROM comprises an array of memory transistors, each one of which has a series connected severable link. In the preferred embodiment, the link is a sichrome strip that is located on top of the IC field oxide where it is visible after wafer fabrication. The link can then be laser severed to program the memory in the wafer die sort operation in the manufacturing process.

The memory array is associated with address decoders for controlling memory operation. Output decoders respond to the memory elements to provide a suitable output structure. In the preferred embodiment, the output decoder is composed of two input gates with one input having a hysteresis characteristic.

Also associated with the memory is an external simulation arrangement that can be used to simulate the word content in the memory array. Means are provided for bypassing the memory and for operating the output decoder so that an externally applied word can be used for memory content simulation. This permits the insertion of a word and manipulation of the word content to achieve a desired result in the associated LSI circuit. The desired word can then be laser programmed into the memory by severing those sichrome links that will cause the memory to reproduce that word.

Thus, after the LSI circuitry is manufactured, it can be digitally trimmed using the on-chip LPROM. The correct trim words can be found during wafer die sort and laser programmed into the device so that very complex, highly accurate LSI circuits can be manufactured without requiring subsequent individual trimming.

BRIEF DESCRIPTION OF THE DRAWING

FIG. 1 is a schematic diagram showing a four by four memory array;

FIG. 2 is a cross section showing of the construction of a memory element;

FIG. 3 shows the topography of a preferred arrangement of an adjacent pair of memory elements;

FIG. 4 is a schematic-block diagram showing a memory system with address and output decoders and means for bypassing and simulating memory content;

FIG. 5 is a schematic diagram of a prior art two input NAND gate using CMOS devices; and FIG. 6 is a schematic diagram of a two input NAND gate in which one input has a hysteresis characteristic.

DESCRIPTION OF THE INVENTION

In FIG. 1, a memory array 10 is shown as having sixteen locations located in a four by four configuration. This simple configuration is only for the purpose of the following explanation. Any desired array size and form can be employed in practicing the invention. The array shown forms four columns, each of which is associated with a decoder line. The four lines, labeled 11 through 14, address the array by way of decoder 15. Four bit lines 18–21 are associated with the memory, with line 18 designated as the MSB and line 21 as the LSB.

The memory contains sixteen p channel transistors, each having its source connected to $+V_{CC}$. Each transistor has a severable link illustrated as a resistor connected between its associated drain electrode and the word line it represents. Each word line has a resistor, one of 22–25, connected to node 26, which is shown as grounded. Normally, the decoder lines will be high (near $+V_{CC}$), thus turning the associated transistors off. With the transistors off, the word line resistors will pull the associated word lines low. As a practical matter, the word line resistors 22–25 are made about ten times the value of the resistance value in the severable links in series with the transistors. Then when an address line goes low, as determined by the address at terminals 16 and 17, the transistors connected thereto will be turned on. When on, the p channel transistors will act as pullup resistors of low value and their drain electrodes will operate near $+V_{CC}$. If the severable link is intact, it will act as a voltage divider with the associated word line resistor and the word line will be pulled to about 90% of $+V_{CC}$. This would represent a logic "one."

If the severable links are actually severed, by means to be described in more detail hereinafter and as shown by the X designations, the memory will be programmed as shown in the following table:

| ADDRESS | | ADDRESS LINES | | | | LOGIC OUTPUT LINES | | | | STORED WORD |
|---|---|---|---|---|---|---|---|---|---|---|
| 16 | 17 | 11 | 12 | 13 | 14 | 18 | 19 | 20 | 21 | |
| 0 | 0 | L | H | H | H | H | H | H | L | 1110 |
| 0 | 1 | H | L | H | H | L | H | H | H | 0111 |
| 1 | 0 | H | H | L | H | H | L | H | L | 1010 |
| 1 | 1 | H | H | H | L | L | L | L | H | 0001 |

It can be seen that the two bit address will result in a single address line going low so as to turn on a single selected column of transistors. The output or stored four bit word is an arbitrary function of the severed (or programmed) links in the array. Before programming, all of the four bit stored words would be 1111.

FIGS. 2 and 3 represent a cross section and topography, respectively, of a preferred form of construction of a pair of bit locations in a memory array. These drawings represent a fragment of an IC chip and are not to scale. The dimensions have been exaggerated to show structural details. It is to be understood that the devices and structures are of state of the art construction.

The substrate wafer 30 is typically lightly doped n type silicon. The wafer is covered in most areas by a field oxide 31 which is typically grown to a thickness of about one micron. A p channel transistor at 32 is fabricated by diffusing p+ regions 33 and 34 which act as a drain and source electrodes, respectively. As can be seen in FIG. 2 a region of thin (or gate) oxide exists between source and drain and is covered by gate metallization 35. As shown in FIG. 3, gate metal 35 can be a conductive line that connects a number of transistors to a particular memory address line. The transistor is surrounded by an N+ diffused guard ring 36. As can be seen in FIG. 3, the transistors are constructed in pairs 32 and 32' that have a single or common source diffusion 34 and separate drain diffusions 33 and 33'. Metal line 38 is the memory $+V_{CC}$ line and makes ohmic contact at 44 to the transistor source diffusion 34.

Metal 39 represents a severable conductive link. It is preferably composed of a thin layer of sichrome which is the name given an alloy of about 30% chromium in silicon. This material can be codeposited as an alloy to a thickness that is thought to be between 90 A and 600 A thick. This alloy can be deposited to reliably produce a film resistance of about 1.5 Kohms per square, adheres well to silicon oxide, and is easily passivated by an overlying deposited glass layer 43. Since the film is relatively thin, it can be precision contoured photolithographically to create relatively precise moderately high value resistors. Such resistive films can be ohmically contacted by conventional overlying metal films. As shown in FIGS. 2 and 3, metal film 40 connects drain electrode 33 via ohmic contact 41 to link 39, the other end of which connects to word line metal 42.

One of the reasons for selecting sichrome as the metal for link 39 is the ease of its removal via laser trimming. This characteristic is disclosed in copending application Ser. No. 877,915 filed Feb. 15, 1978, by Thomas P. Redfern titled "TRIM STRUCTURE FOR INTEGRATED CAPACITORS" and assigned to the assignee of the present invention. This application discloses the composition of sichrome, its laser trimmability and the thin film alternatives which include molybdenum, tungsten, tantalum, nickel-chromium alloys, niobium, and tantalum nitride.

As shown in FIG. 3, one of the links (39') has been severed by laser 45. It is preferred that a neodymium doped YAG laser operating at a wavelength of about 1.06 microns be employed. In this form of memory programming a "zero" is entered by cutting across link 39'. Thus, even though transistor 32' is turned on, no current will flow to pull word line 42' up to a logic "one." Since the links 39 and 39' are located over field oxide and since laser 45 can be operated at relatively low power, the link can be severed without damage to the underlying silicon. It has been determined that sichrome links can be severed using the preferred laser at about 10% of the power required to sever an aluminum conductor such as lines 38 or 42. The required power is so low that the laser beam can be caused to traverse an underlying silicon p n junction without degrading the junction. Therefore, while links 39 and 39' are shown located over a device-free substrate portion, they could be located on any portion of the field oxide.

FIG. 4 shows additional circuitry associated with a memory array 10 as was described in connection with FIG. 1. The address decoder 15 and its operation is conventional and operates as disclosed in connection with FIG. 1. Word lines 18–21 are connected to one input of a group of NAND gates 50–53, respectively. It will be noted that when the second input terminals of NAND gates 50–53 are high, the gates act as simple logic inverters. Inverters 54–57 will cause the word output terminals 58–61 to repeat the contents of memory array 10. This is the normal memory read state.

Prior to programming memory array 10, it can be seen that all word lines 18–21 will be normally high when the memory is addressed. This means that the state of the lower input on each of NAND gates 50–53 will be repeated on word outputs 58–61. This also means that the memory output can be simulated prior to its programming. That is, words can manually be applied to the memory output to determine their effect upon an associated system. If desired, the word can be manipulated to achieve a desired effect. That word can then be duplicated by suitably programming (laser severing) the appropriate portions of memory array 10.

The memory simulator operates as follows. Prior to any link severing in memory array 10 lines 18–21 will all operate near $V_{CC}$ and the upper inputs to NAND gates 50–53 will be high. When a test probe, illustrated as probe 65, is applied to pad 71 and coupled to ground, through an associated off chip switch 65' as shown, transistors 76–79 have their sources grounded and thereby become operable. Each of the lower inputs to NAND gates 50–53 is connected to a pull-up transistor in the group 67–70. Since each of these inputs is also coupled to the drain terminal of a separate n channel transistor in the group 76–79, when pad 71 is grounded, each transistor will respond to the logic state of a related pad in the group 72–75, as determined by additional external probe means not shown. The externally applied logic will therefore operate NAND gates 50–53. Thus, as long as pad 71 is grounded, if pad 72 is low at logic "zero," transistor 76 will be off and the lower terminal of gate 53 will be high. If pad 72 is high at logic "one," transistor 76 will be on and the lower input to NAND gate 53 low. The bit condition on output 61 can be forced as desired. Outputs 58–60 will similarly be forced by the signals applied to pads 73–75.

The potentials applied to the pads can, therefore, simulate the bit content manually of any word contained in memory array 10. The word inserted simulates the memory content for that column selected by decoder 15. When probe 65 is removed from pad 71, transistor 66 will pull all of the sources of transistors 76–79 close to $+V_{CC}$ and thereby disable them.

Where the memory is to be used in conjunction with other circuitry in an IC, the manual programming permits a preview of the effect of the memory word. In a typical system before the memory is programmed, the correct digital word is determined by first bypassing the memory by grounding pad 71. The manual word is selected by manipulating the signals on pads 72–75 until the desired effect is achieved. The memory locations in array 10 are then programmed by laser severing to write in that word determined manually. Once each column of array 10 is thus treated, the entire array is programmed. Since this is done after circuit manufacture, the permanent character of the digital trim is achieved.

In FIG. 4, it will be noted that each of NAND gates 50–53 has a hysteresis symbol associated with the upper input terminal. This is the terminal coupled to the memory array 10. Thus, when the lower terminals of the NAND gates 50–53 are high, they function as logic inverters with hysteresis. The resultant transfer characteristic will allow the gate circuit to react reliably to the logic levels produced by the operation of memory array 10 as described above. It was shown that a logic zero on lines 18–21 was close to ground potential, whereas a logic "one" was close to 90% of $+V_{CC}$. The 90% varies with the manufacturing process and, therefore, is not precise. That is, lines 18–21 will all produce slightly different logic "one" values. By making the upper trip point well below the 90% of $V_{CC}$ level, the circuit will readily respond to the logic "one" level. The addition of hysteresis to the gate will greatly enhance its noise immunity and, therefore, its reliability. Since the logic zero state is at ground, noise will not be a problem.

FIG. 5 shows a conventional CMOS NAND gate. Two series connected n channel transistors 85 and 86 are coupled to a pair of parallel connected p channel transistors 87 and 88, which act as load devices. If either input 89 or 90 is low or at logic "zero," there will be no conduction in transistors 85 and 86. This input condition will ensure that at least one of transistors 87 or 88 will be on, thus pulling output terminal 91 high. If both inputs 89 and 90 are high at logic "one," both of transistors 87 and 88 will be off and both of transistors 85 and 86 will be on to pull output terminal 91 low. The logic switching will occur around a transition level determined mainly by device ratioing.

In FIG. 6, a NAND gate with hysteresis on one input is shown. Series connected n channel transistors 91 and 92 and p channel load transistor 93 are conventional. Input 98 behaves as a conventional NAND gate input. However, for input 97, three interconnected p channel transistors 94–96 act as the load device operated by input 97. Transistors 94 and 95 are coupled in series with their gates connected to input 97. Transistor 96 is coupled from the juncture of transistors 94 and 95 to ground and its gate is connected to output terminal 99.

For the following discussion, it will be assumed that input 98 is high and input 97 will then operate the gate as an inverter. Accordingly, transistor 91 will be on and transistor 93 is off.

Assuming that the input 97 is low, transistor 92 is off, and transistors 94 and 95 will be on. Output terminal 99 will be high and transistor 96 will be off. As the input rises, transistor 92 will turn on and form an inverter with load transistors 94 and 95 with nothing more, this inverter would operate with a transition typically near $V_{CC}/2$. The rising input increases conduction in transistor 92 and reduces conduction in transistors 94 and 95. At some point on this transition which starts out softly, the voltage drop across transistor 95 will exceed the threshold voltage of transistor 96, which will start to conduct and pull the source of transistor 95 lower, thereby tending to hasten its turn-off. This, in turn, increases conduction in transistor 96, thus creating a regenerative action that rapidly turns transistor 95 off and transistor 96 on. Thus, the output rapidly falls to ground and remains there as the input terminal 97 goes to $V_{CC}$. It can be seen that this transition occurs at close to or slightly greater input voltage than that of a conventional CMOS inverter transition.

Starting now with input terminal 97 high and output terminal 99 low, it can be seen that transistor 92 will be on and transistors 94 and 95 will be off. Since the gate of transistor 96 will be low, it is on but cannot conduct because transistor 94 is off. As the input on terminal 97 is lowered, the first action is to turn transistor 94 on when its gate drops to a threshold below $V_{CC}$. At this point, transistors 94 and 96 will conduct and start to pull the source of transistor 95 toward $V_{CC}$. Transistor 96 will try to clamp the potential across transistor 95 to one threshold, thus keeping its source below gate potential, and holding it off so that the output remains at ground. As the input falls still further, transistor 94 will pull the source toward $V_{CC}$ and at some point, as determined by device ratioing, transistor 95 will start to turn on. However, it can be seen that the gate of transistor 95 must be pulled one threshold below its source before it can turn on and this cannot happen until the input potential has fallen well below the previously described transition, which is close to $V_{CC}/2$. Once transistor 95 turns on, it will pull terminal 99 up, thus decreasing conduction in transistor 96. This, in turn, results in an increase in the source voltage of transistor 95, thereby turning it on still harder. Thus, a regenerative action occurs and the circuit will very quickly revert to the state where output terminal 99 goes to $V_{CC}$ and will remain there as the input at terminal 97 goes to ground.

Thus, the circuit has a substantially rectangular hysteresis loop that has an upper trip point relatively close to $V_{CC}/2$ and a lower trip point at some lower value that is well above ground potential. The precise location of the trip points is set by the transistor sizes.

The circuit of FIG. 6 has been constructed using conventional state of the art CMOS technology. The various devices were ratioed as shown in the following chart. The fractions are the device width/length dimensions in mils.

| DEVICE | W/L |
|--------|---------|
| 91 | 1/0.3 |
| 92 | 0.5/3 |
| 93 | 0.5/0.35 |
| 94 | 1/0.35 |
| 95 | 1/0.35 |
| 96 | 1.5/3.5 |

These values provided the characteristics desired for the NAND gates 50-53 of FIG. 4 operating with the array of FIG. 1. Using a 5 volt $V_{CC}$ supply, the upper trip point is typically about 3 volts and the lower trip point is about 2 volts. This characteristic provides good noise immunity using the logic levels of zero and about 4.5 volts afforded by the LPROM array.

The invention has been described and specific arrangements for its implementation have been detailed. There are equivalents and alternatives that are within the spirit and intent of the invention that will occur to a person skilled in the art. For example while CMOS construction is preferred, other forms can be used, such as NMOS, PMOS. Furthermore many of the active devices could be junction field effect transistors or other bipolar devices. Accordingly, it is intended that the scope of the invention be limited only by the claims that follow.

We claim:

1. A laser programmable read only memory suitable for incorporation into a monolithic integrated circuit, said circuit including a plurality of transistors, each of which has a pair of controlled conduction electrodes and a control electrode, and a surrounding field oxide, said memory comprising:

a plurality of memory locations arranged in a configuration of columns and rows, each location comprising one of said transistors and severable link means coupled in series therewith;

word line means associated with each row of said configuration and coupled to each transistor in said row, means connected to each word line means for electrically actuating said word line to a first logic state;

address line means associated with each column of said configuration, said address line means coupled to said control electrode of each of said transistors in said column, whereby when said address line is electrically operated to turn said transistors on, the transistor by way of said severable link means will actuate said word line means to a second logic state.

2. The memory of claim 1 wherein said severable link means is constructed to have an electrical resistance that is smaller than the electrical resistance of said means connected to each word line means.

3. The memory of claim 2 where said severable link means comprise a conductive metal film located on said field oxide of said integrated circuit whereby said film can be severed by traversing it with a laser beam.

4. The memory of claim 3 wherein said metal film is composed of a material selected from the group consisting of sichrome, molybdenum, tungsten, tantalum, nickel chromium alloy, niobium and tantalum nitride.

5. The memory of claim 4 wherein said metal film is composed of sichrome and said laser operates at a wavelength near one micron.

* * * * *